(12) United States Patent
Tang

(10) Patent No.: US 12,166,070 B2
(45) Date of Patent: Dec. 10, 2024

(54) SEMICONDUCTOR TRANSISTOR STRUCTURE AND MANUFACTURING METHOD

(71) Applicant: CHANGXIN MEMORY TECHNOLOGIES, INC., Hefei (CN)

(72) Inventor: Jifeng Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 600 days.

(21) Appl. No.: 17/487,830

(22) Filed: Sep. 28, 2021

(65) Prior Publication Data

US 2023/0006035 A1 Jan. 5, 2023

Related U.S. Application Data

(63) Continuation of application No. PCT/CN2021/107614, filed on Jul. 21, 2021.

(30) Foreign Application Priority Data

Jul. 2, 2021 (CN) ......................... 202110749993.2

(51) Int. Cl.
*H01L 29/06* (2006.01)
*H01L 29/08* (2006.01)
(Continued)

(52) U.S. Cl.
CPC ...... *H01L 29/0607* (2013.01); *H01L 29/0847* (2013.01); *H01L 29/401* (2013.01); *H01L 29/41775* (2013.01)

(58) Field of Classification Search
None
See application file for complete search history.

(56) References Cited

U.S. PATENT DOCUMENTS

2004/0058548 A1 3/2004 Sohn
2005/0230712 A1* 10/2005 Michimata ........ H01L 21/76805
257/E21.538
(Continued)

FOREIGN PATENT DOCUMENTS

CN 1142683 A 2/1997
CN 1186327 A 7/1998
(Continued)

OTHER PUBLICATIONS

International Search Report cited in PCT/CN2021/095835, mailed Aug. 5, 2021, 9 pages.
(Continued)

*Primary Examiner* — Bradley Smith
(74) *Attorney, Agent, or Firm* — Syncoda LLC; Feng Ma

(57) ABSTRACT

The present application discloses a semiconductor transistor structure, which includes: a substrate formed with a well region of a first conductive type, a gate structure being disposed on the substrate; a source/drain region of a second conductive type disposed in the well region of the first conductive type, the source region and the drain region being located on two sides of the gate structure respectively; a contact hole formed at a position corresponding to the source/drain region; and a conductive metal filled in the contact hole, the bottom of the contact hole being implanted with impurity ions for decreasing the contact resistance of the contact hole, and the impurity ion concentration at a peripheral region where the bottom of the contact hole comes into contact with the source/drain region being lower than the impurity ion concentration at a middle region.

12 Claims, 7 Drawing Sheets

(51) Int. Cl.
*H01L 29/40* (2006.01)
*H01L 29/417* (2006.01)

(56) References Cited

U.S. PATENT DOCUMENTS

| | | |
|---|---|---|
| 2007/0148968 A1 | 6/2007 | Kwon et al. |
| 2008/0099852 A1* | 5/2008 | Faul ................. H01L 21/26513 |
| | | 257/E21.336 |
| 2012/0282751 A1 | 11/2012 | Oh et al. |

FOREIGN PATENT DOCUMENTS

| | | |
|---|---|---|
| CN | 1505120 A | 6/2004 |
| CN | 1276488 C | 9/2006 |
| CN | 101174649 A | 5/2008 |
| CN | 102569180 A | 7/2012 |
| CN | 105589299 A | 5/2016 |
| CN | 107112212 A | 8/2017 |
| KR | 20100026732 A | 3/2010 |
| WO | 2011014020 A2 | 2/2011 |

OTHER PUBLICATIONS

International Search Report cited in PCT/CN2021/107614, mailed Mar. 28, 2022, 8 pages.

\* cited by examiner

SEMICONDUCTOR TRANSISTOR STRUCTURE AND MANUFACTURING METHOD

CROSS-REFERENCE TO RELATED APPLICATIONS

This application is a continuation application of International Patent Application No. PCT/CN2021/107614, filed on Jul. 21, 2021, which claims priority to Chinese Patent Application No. 202110749993.2, filed with the Chinese Patent Office on Jul. 2, 2021 and entitled "SEMICONDUCTOR TRANSISTOR STRUCTURE AND MANUFACTURING METHOD." International Patent Application No. PCT/CN2021/107614 and Chinese Patent Application No. 202110749993.2 are incorporated herein by reference in their entireties.

TECHNICAL FIELD

The present application relates to the field of semiconductor integrated circuits, and in particular to a semiconductor transistor structure and a manufacturing method.

BACKGROUND

Metal-oxide semiconductor transistors (MOS transistors) are a class of critical electronic components in today's semiconductor products, and their electrical performance is the key to the quality of integrated circuits. A MOS transistor is a 4-terminal electronic component consisting of a gate, a source, a drain, and a substrate. There is an oxide insulating layer between the gate structure and the substrate. When the MOS transistor operates, an operating voltage is applied to the gate such that an inversion channel is formed on a side of the substrate close to the oxide insulating layer. Since the source and the drain are also inversely doped, they are turned on, thereby achieving the purpose of controlling the operation of the transistor switch.

At present, after the source and drain regions of a MOSFET are formed, specific regions are opened in the source and drain regions through a photolithography mask, and then etched to form a contact hole in which a conductive material is deposited. In order to reduce a contact resistance of the contact hole, the current process typically involves implanting, prior to deposition of the conductive material in the contact hole and subsequent to doping of the source and drain regions, impurity ions into the bottom of the contact hole for purpose of the same type of ion doping superposition (low-concentration doping, usually one-tenth of the doping concentration in the source and drain regions). As a result, the doping concentration of the impurity ions in the source and drain regions is increased, and a PN junction with a larger ion concentration difference is formed between the source and drain regions and the substrate. If a voltage is applied to the source and drain regions, it is easier to turn on the PN junction, resulting in leakage currents. In addition, higher electric field strengths will be created at the bottom corner or tip of the contact hole, and under the effect of a tip electric field, the leakage currents of the PN junction will be strengthened. Current leakage has a tremendous impact on device performances, so there exists a need to propose a novel MOS transistor structure and manufacturing method to reduce the leakage currents.

SUMMARY

An object of the present application is to provide a semiconductor transistor structure. In order to solve the problem of leakage currents between the source and drain regions and the substrate caused by contact hole doping in the existing semiconductor transistors, the impurity ion concentration at a peripheral region where the bottom of the contact hole comes into contact with the source and drain regions is set to be lower than the impurity ion concentration at a middle region, the ion concentration difference between the source and drain regions and the substrate is decreased while the value of resistance in a vertical direction of the contact hole remains unchanged, thereby reducing the leakage currents.

To solve the above-mentioned technical problem, a first aspect of the present application provides a semiconductor transistor structure, which includes: a substrate formed with a well region of a first conductive type, a gate structure being disposed on the substrate; a source/drain region of a second conductive type disposed in the well region of the first conductive type, the source region and the drain region being located on two sides of the gate structure respectively; a contact hole formed at a position corresponding to the source/drain region, the contact hole extending downwards into the well region of the first conductive type; and a conductive metal filled in the contact hole, the bottom of the contact hole being implanted with impurity ions for decreasing the contact resistance of the contact hole, and the impurity ion concentration at a peripheral region where the bottom of the contact hole comes into contact with the source/drain region being lower than the impurity ion concentration at a middle region.

A second aspect of the present application provides a manufacturing method of semiconductor transistors, which includes: providing a substrate formed with a well region of a first conductive type; forming a gate structure on a surface region of the well region of the first conductive type; forming a source/drain region of a second conductive type in the well region of the first conductive type on two sides of the gate structure respectively; forming a contact hole respectively at the source/drain region; forming a high concentration region with impurity ions at a middle region of the bottom of the contact hole, and forming a low concentration region with impurity ions at a peripheral region where the bottom of the contact hole comes into contact with the source/drain region; and depositing a conductive layer in the contact hole to create conductive contact.

DESCRIPTION OF EMBODIMENTS

For a better clarity of the objects, technical solutions, and advantages of the present application, the present application will be further described in detail below in conjunction with the specific implementation and with reference to the accompanying drawings. It is to be understood that these descriptions are merely exemplary, rather than limitations to the scope of the present application.

Figure 1:
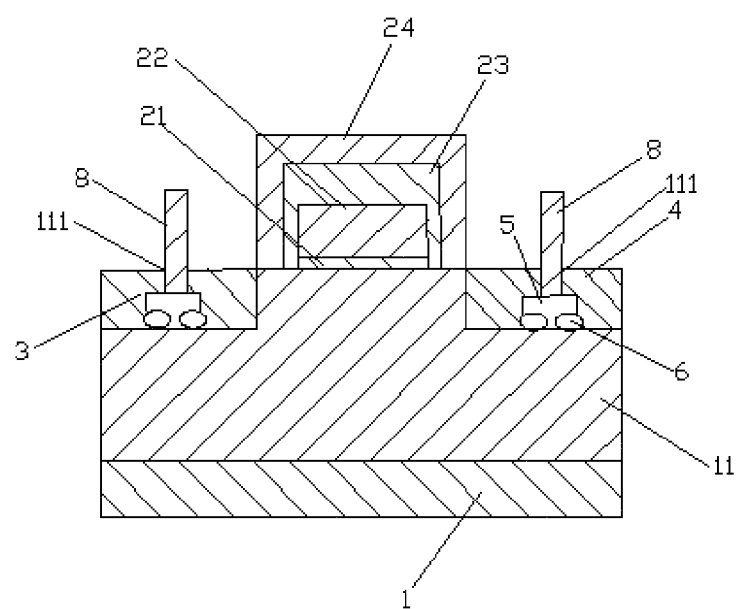
FIG. 1 is a schematic full section structure diagram according to an embodiment of the present application.

As illustrated in FIG. 1, provided according to the specific implementation of the present application is a semiconductor transistor structure, which includes a substrate 1, wherein a well region of a first conductive type 11 is formed on a surface region of the substrate 1, and the well region of the first conductive type 11 is N-type doping, with doping ions being selected from any of phosphorus ions, arsenic ions and antimony ions. Alternatively, the substrate 1 is a silicon substrate.

A gate structure 2 is disposed on the surface of the well region of the first conductive type 11, the gate structure 2 includes a dielectric layer 21 and a polysilicon gate layer 22, the dielectric layer 21 is located on the surface of the well region of the first conductive type 11, and the material for the dielectric layer 21 may be one of high-k materials such as hafnium oxide, hafnium silicate, lanthanum oxide, zinc oxide, zinc silicate, tantalum oxide, titanium oxide, barium strontium titanate, barium titanate, strontium titanate, yttrium oxide, aluminum oxide, ferroelectric thin film, niobic zinc acid, and lead titanate lead. The polysilicon gate layer 22 is disposed on the dielectric layer 21, and the material for the polysilicon gate layer 22 may include, for example, one or more of polysilicon, hafnium, titanium, tantalum, aluminum, zirconium, ruthenium, palladium, platinum, cobalt, nickel and oxides and carbides thereof.

A source region 3 and a drain region 4 of a second conductive type doping are formed in the surface of the well region of the first conductive type 11, and the source region 3 and the drain region 4 are symmetrically disposed on two sides of the dielectric layer 21. The source region 3 and the drain region 4 may be formed by performing counter ion implantation on regions located on two sides of the gate structure 2 in the surface of the well region of the first conductive type 11. The type of conductive ions doped in the source region 3 and the drain region 4 is dictated by the specific semiconductor device type formed there from. In case of a PMOS device in the embodiment of the present application, the source and drain regions are P-type doping, with doping ions being selected from any of boron ions, aluminum ions and indium ions.

A contact hole 111 is etched at a position region corresponding to the source region 3/drain region 4, the contact hole 111 extends downwards into the well region of the first conductive type 11, and a depth of the contact hole extending downwards is 20 to 50 nm. The bottom region of the contact hole 111 is doped with impurity ions 5 that are selected from any of boron ions, aluminum ions and indium ions, and in this embodiment, the boron ions are taken as an example for illustration. The boron ions are activated by rapid thermal processing (RTP) and then diffused at the bottom region of the contact hole 111, and in this way the value of contact resistance of the contact hole 111 is lowered.

A peripheral region where the bottom of the contact hole 111 comes into contact with the source region 3/drain region 4 is filled with counter ions 6, which are used for neutralizing the boron ions and are selected from any of phosphorus ions, arsenic ions and antimony ions, and according to the embodiment of the present application, the phosphorus ions are taken as an example for illustration. Addition of the phosphorus ions causes the boron ion concentration of most of the carriers at the peripheral region where the bottom of the contact hole 111 comes into contact with the source region 3/drain region 4 to be lower than the boron ion concentration at the middle region, the ion concentration difference between the source region 3/drain region 4 and the well region of the first conductive type 11 is decreased without affecting the value of resistance in a vertical direction of the contact hole 111, thereby reducing the leakage currents.

Figure 2:
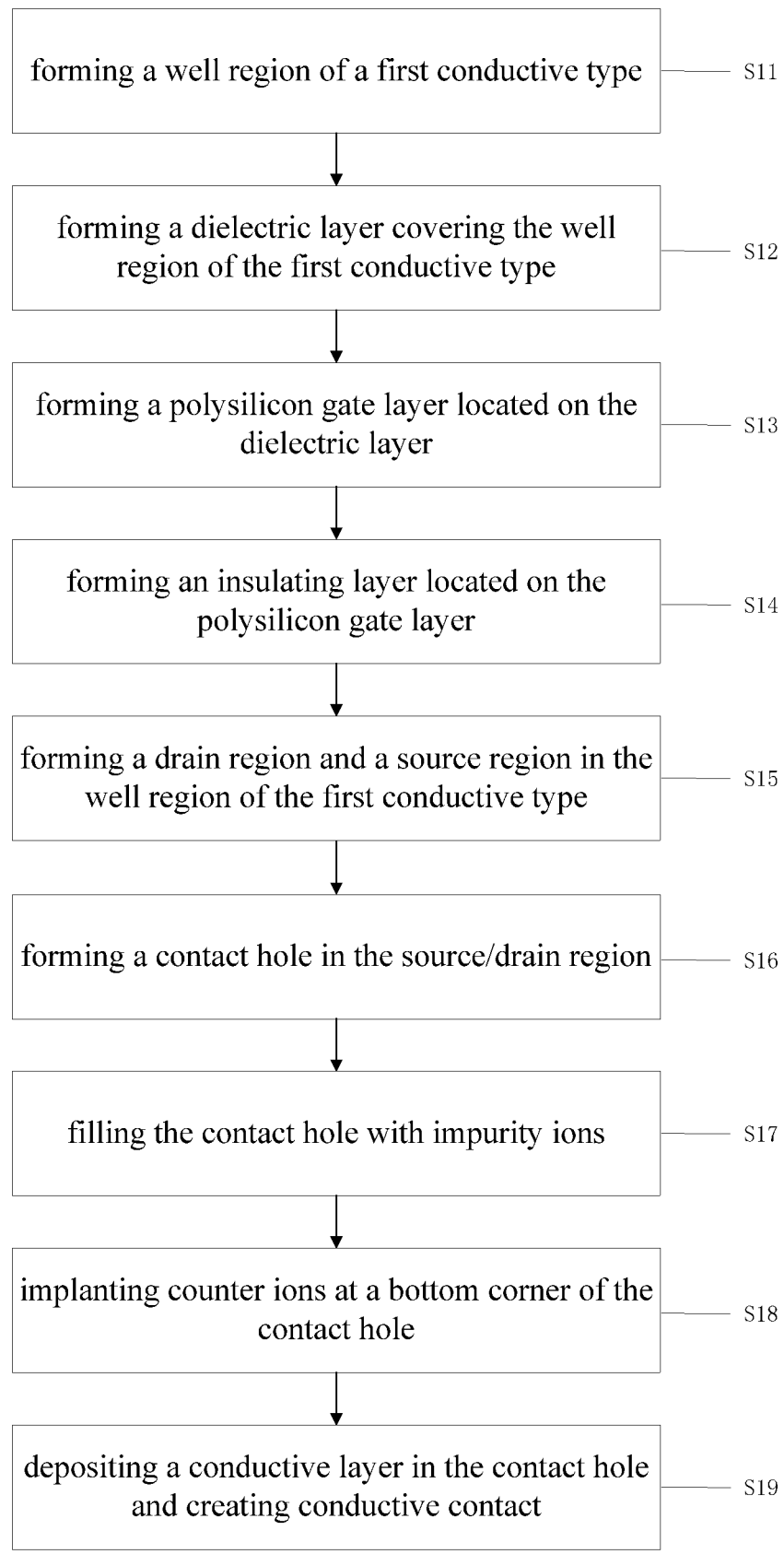
FIG. 2 is a flow chart illustrating a method for formation of the MOS transistor structure according to an embodiment of the present application.

FIG. 2 is a flow chart illustrating a method for formation of the MOS transistor structure in the present application;

FIG. 3 to FIG. 8 are schematic sectional diagrams illustrating a main process during formation of the MOS transistor structure in the present application.

Figure 3:
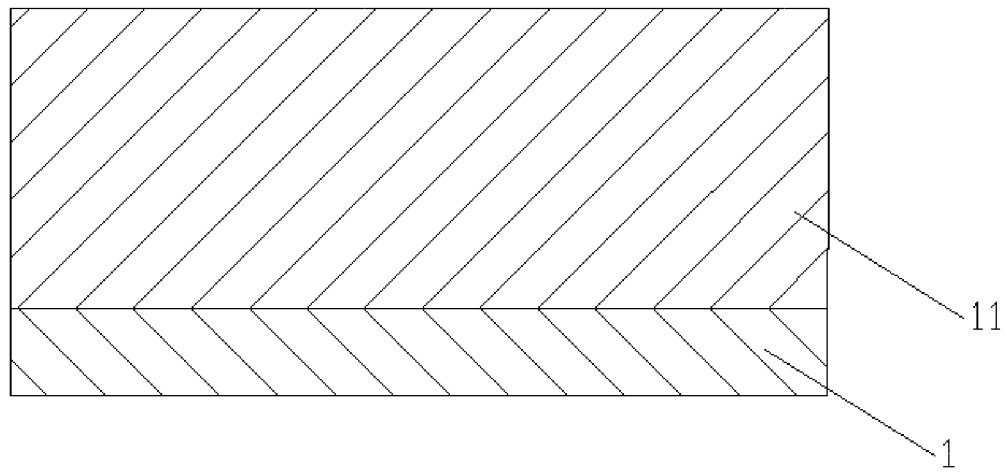
FIG. 3 to FIG. 8 are schematic sectional diagrams illustrating a main process during formation of the MOS transistor structure according to a specific implementation of the present application.

The present application further provides a manufacturing method of the semiconductor transistor structure, which includes the following steps:

S11: forming a well region of a first conductive type, as shown in FIG. 2 and FIG. 3.

In particular, a P-type substrate 1 is provided, and subjected to N-type doping in a manner of ion implantation. In this way, an N-type well region of a first conductive type 11 is formed. Alternatively, the specific material for the substrate 1 may be chosen by those skilled in the art according to actual requirements, and in the specific implementation of the present application, a silicon substrate is taken as an example for illustration.

Figure 4:
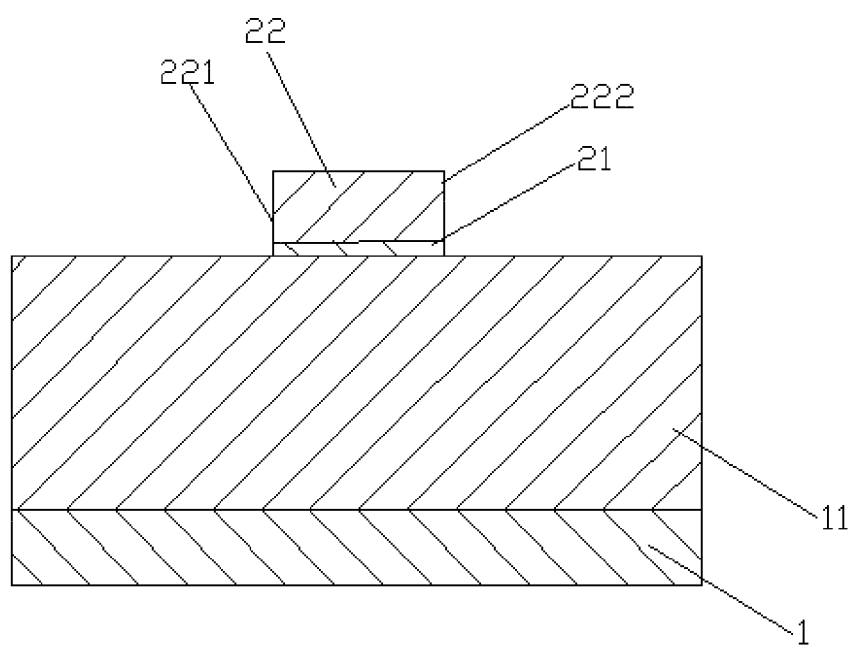

S12: forming a dielectric layer covering the well region of the first conductive type, as shown in FIG. 2 and FIG. 4.

In particular, a thermal oxidation process is utilized to deposit a dielectric layer 21 on the surface of the well region of the first conductive type 11 of the substrate 1, such that the dielectric layer 21 covers the surface region of the well region of the first conductive type 11. The material for the dielectric layer 21 is an insulating material the specific type of which may be chosen by those skilled in the art according to actual requirements. The thickness of the dielectric layer 21 may be set as required, and the preferable thickness may be 30 to 50 angstroms.

S13: forming a polysilicon gate layer located on the dielectric layer, as shown in FIG. 2 and FIG. 4.

In particular, a semiconductor wafer including the dielectric layer 21 is transferred into a low-pressure chemical vapor deposition apparatus and silane is fed into a process chamber of the apparatus. Polysilicon is deposited on the surface of the dielectric layer 21 after the silane is decomposed. Upon completion of the deposition of the polysilicon, a polysilicon doping operation may also be carried out. In a photoresist layer, a gate region pattern is formed by exposure and developing procedures. With the photoresist layer as a mask, the dielectric layer 21 and the polysilicon layer outside of the gate region pattern is removed through a corrosion process, thus forming the polysilicon gate layer 22.

Figure 5:
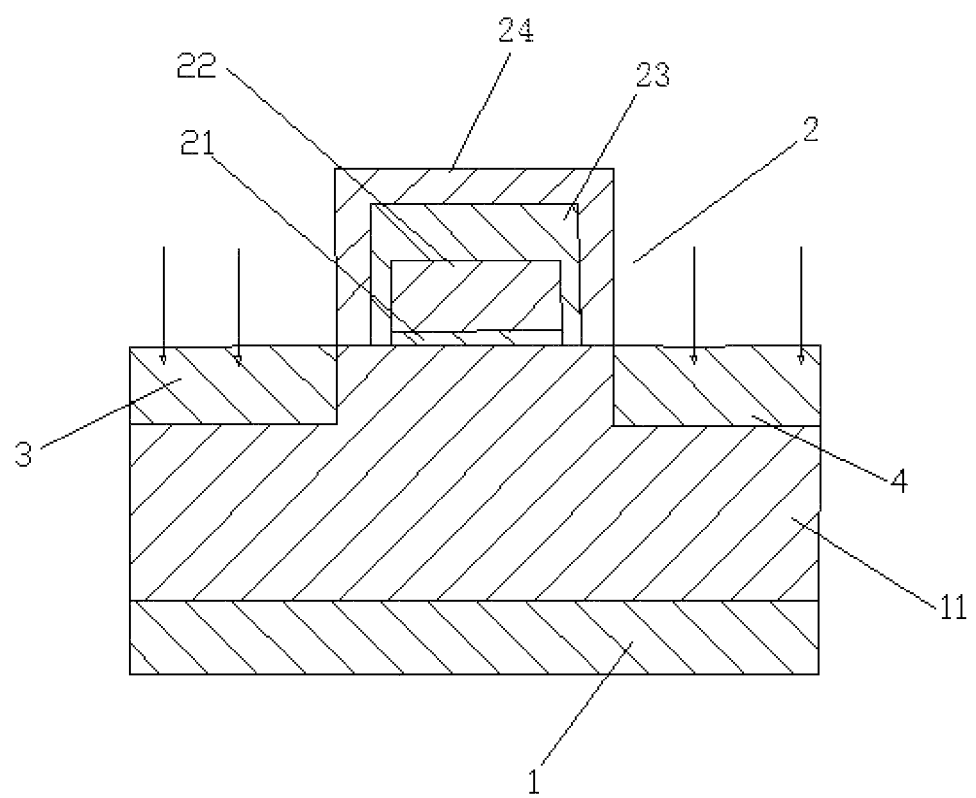

S14: forming an insulating layer located on the polysilicon gate layer, as shown in FIG. 2 and FIG. 5.

In the drawing, an insulating silicon nitride layer 23 covering the top and sidewall of the polysilicon gate layer 22 is formed by chemical vapor deposition, with the thickness at the top ranging from 0.1 μm to 3 μm and the thickness at the sidewall ranging from 10 nm to 30 nm. On the basis of the insulating silicon nitride layer 23, a silicon oxide layer 24 is formed, which extends to the sidewall of the insulating silicon nitride layer 23, i.e., the insulating silicon nitride layer 23 is wrapped in the silicon oxide layer 24 to prevent the gate structure 2 from being affected during subsequent ion implantation in the source and drain regions. The thickness of the side of the silicon oxide layer 24 defines the positions of the source and drain regions. The insulating silicon nitride layer 23/silicon oxide layer 24 serves simultaneously as a self-alignment structure for subsequent ion implantation in the source and drain regions.

S15: forming a drain region and a source region in the well region of the first conductive type, as shown in FIG. 4 and FIG. 5.

In particular, self-alignment may be achieved using the gate structure 2/silicon oxide layer 24. Source and drain forming regions will be formed on the surface of the well region of the first conductive type 11 and on left and right sides of the gate structure 2, the two sides of the silicon oxide layer 24 are considered as self-alignment boundaries at the time of the source/drain region implantation, and conductive impurities are simultaneously implanted, in an ion implantation manner, into the source/drain region to form the source region 3 and the drain region 4.

Figure 6:
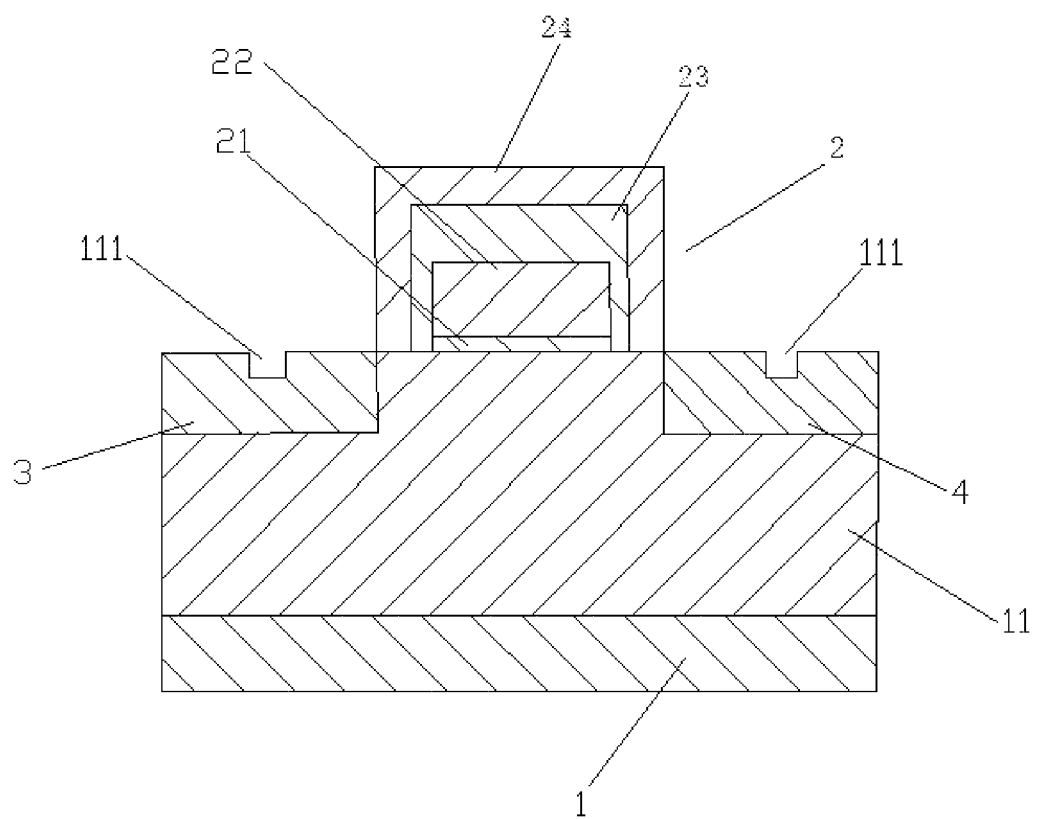

S16: forming a contact hole in the source/drain region, as shown in FIG. 2 and FIG. 6.

In particular, a photoresist layer with a pattern is formed on the surface of the drain region 4. Then, with this photoresist layer as a mask, the surface region of the drain region 4 located at a second side outer portion 222 of the polysilicon gate layer 22 is etched, so as to form, on the surface region of the drain region 4, the contact hole 111 exposing the interior of the drain region 4. The way of forming the contact hole 111 in the source region 3 is consistent with the way of forming the contact hole 111 in the drain region 4, so a description thereof is not given here (the surface region of the source region 3 located at a first side outer portion 221 of the polysilicon gate layer 22 is etched, so as to form, on the surface region of the source region 3, the contact hole 111 exposing the interior of the source region 3). The mask employed for etching is not limited to the photoresist in the embodiment of the present application, and other mask techniques may be used as well, e.g., metal hard mask, etc.

Figure 7:
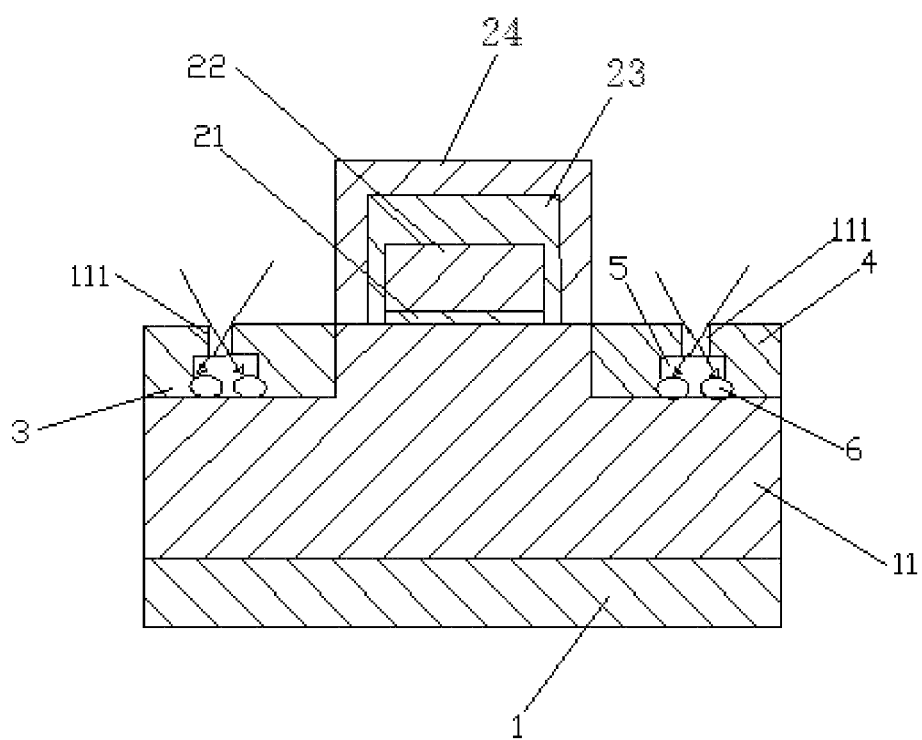

S17: filling the contact hole with impurity ions, as shown in FIG. 2 and FIG. 7.

In particular, impurity ions 5 are implanted into the contact hole 111 using an ion implantation process. Preference is given to boron ions and fluorides thereof, since boron ions are light in weight and easy to diffuse, and boron fluorides can reduce the diffusion of boron and form an amorphization region to reduce the tunneling effect of ion implantation. The ions implanted are activated using a rapid thermal processing or high-temperature annealing process, such that the impurity ions 5 are diffused at the bottom of the contact hole 111. The preferable impurity ions 5 are implanted vertically, with an implantation energy of 2 to 3KeV and an implantation dose of 8E14 to 1E15 atom per $cm^2$.

S18: implanting counter ions at a bottom corner of the contact hole, as shown in FIG. 2 and FIG. 7.

In particular, counter ions 6 are implanted into the contact hole 111, and preference is given to phosphorus ions. The counter ions 6 serve to neutralize the impurity ions 5, and specifically are implanted in an obliquely angled way, such that the counter ions 6 are uniformly distributed at the peripheral region where the bottom of the contact hole 111 comes into contact with the source region 3/drain region 4, the ion concentration difference between the source region 3/drain region 4 and the well region of the first conductive type 11 is decreased without affecting the value of resistance in a vertical direction of the contact hole 111, thereby reducing the leakage currents. Preferably, the counter ions 6 are implanted at an angle of 8 to 12 degrees, with an implantation energy of 15KeV and an implantation dose of 5e13 atom per $cm^2$.

Figure 8:
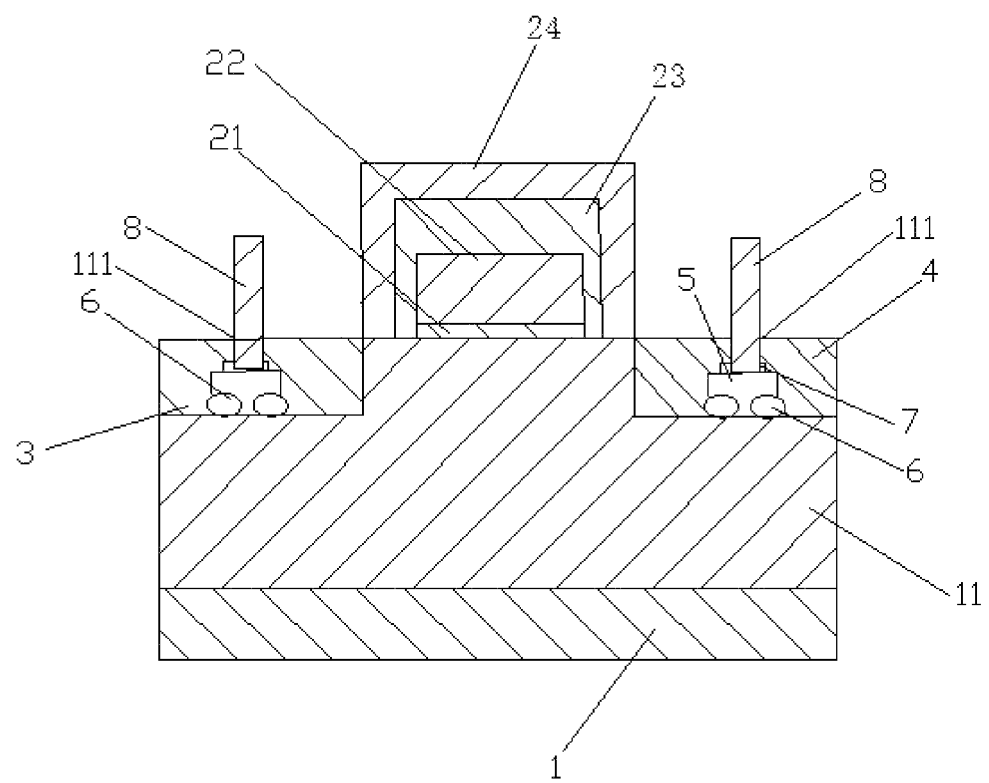

S19: depositing a conductive layer in the contact hole and creating conductive contact, as shown in FIG. 2 and FIG. 8.

In particular, metal cobalt is deposited in the contact hole 111 of the source region 3/drain region 4 via physical vapor deposition or ion sputtering, and a silicon layer is brought into reaction with the cobalt through thermal processing, so as to form a metal silicide 7, namely a cobalt silicide layer is formed. A metal material 8 is deposited on the cobalt silicide layer via low-pressure chemical vapor deposition, rapid thermal chemical vapor deposition or the like, the contact hole 111 is filled up, and the conductive layer is formed. The alternative metal material 8 may be at least one of metal tungsten, aluminum and molybdenum.

In the semiconductor transistor structure and manufacturing method thereof according to the specific implementation of the present application, the counter ions 6 are obliquely implanted into the contact hole 111 to neutralize the impurity ions 5 without affecting the value of resistance in a vertical direction of the contact hole 111, such that the counter ions 6 are distributed at the peripheral region where the bottom of the contact hole 111 comes into contact with the source region 3/drain region 4, thereby reducing the leakage currents and improving the performances of the device.

It is to be understood that the above specific implementations of the present application are used only to exemplify or explain the principle of the present application, and do not constitute a limitation to the present application. Therefore, any modification, equivalent substitution, improvement, etc. made without departing from the spirit and scope of the present application shall be included in the protection scope of the present application. In addition, the appended claims of the present application are intended to cover all variation and modification examples that fall within the scope and boundary of the appended claims, or within the equivalent forms of such scope and boundary.

What is claimed is:

1. A semiconductor transistor structure, comprising:
    a substrate formed with a well region of a first conductive type, a gate structure being disposed on the substrate;
    a source/drain region of a second conductive type disposed in the well region of the first conductive type, the source region and the drain region being located on two sides of the gate structure respectively;
    a contact hole formed at a position corresponding to the source/drain region, the contact hole extending downwards into the well region of the first conductive type; and
    a conductive metal filled in the contact hole, a bottom of the contact hole being implanted with impurity ions for decreasing a contact resistance of the contact hole, and an impurity ion carrier concentration at a peripheral region where the bottom of the contact hole comes into contact with the source/drain region being lower than the impurity ion carrier concentration at a middle region; and
    wherein the peripheral region where the bottom of the contact hole comes into contact with the source/drain region is filled with counter ions for neutralizing the impurity ion carrier concentration.

2. The semiconductor transistor structure according to claim 1, wherein the counter ions have an implantation energy of 15KeV and an implantation dose of 5e13 atom per $cm^2$, and the counter ions are selected from any of phosphorus ions, arsenic ions and antimony ions.

3. The semiconductor transistor structure according to claim 1, wherein the impurity ions have an implantation energy of 2 to 3KeV and an implantation dose of 8E14 to 1E15 atom per $cm^2$, and the impurity ions are selected from any of boron ions, aluminum ions and indium ions.

4. The semiconductor transistor structure according to claim 1, wherein
the well region of the first conductive type is N-type doping, and doping ions are selected from any of phosphorus ions, arsenic ions and antimony ions;
the source/drain region of the second conductive type is P-type doping, and the doping ions are selected from any of boron ions, aluminum ions and indium ions.

5. The semiconductor transistor structure according to claim 1, wherein the conductive metal of the contact hole comprises a metal silicide and a metal material.

6. The semiconductor transistor structure according to claim 5, wherein the metal material comprises tungsten, aluminum and molybdenum.

7. The semiconductor transistor structure according to claim 1, wherein a depth of the contact hole extending downwards is 20 to 50 nm.

8. The semiconductor transistor structure according to claim 1, wherein the gate structure comprises a dielectric layer, a polysilicon conductive layer, an insulating silicon nitride layer and a silicon oxide layer sequentially stacked on the well region of the first conductive type.

9. A manufacturing method of semiconductor transistors, comprising:
providing a substrate formed with a well region of a first conductive type;
forming a gate structure on a surface region of the well region of the first conductive type;
forming a source/drain region of a second conductive type in the well region of the first conductive type on two sides of the gate structure respectively;
forming a contact hole respectively at the source/drain region;
forming a high concentration region with impurity ions carrier at a middle region of a bottom of the contact hole, and forming a low concentration region with impurity ions carrier at a peripheral region where the bottom of the contact hole comes into contact with the source/drain region; and
depositing a conductive layer in the contact hole to make conductive contact; and
wherein forming the low concentration region with impurity ions carrier at the peripheral region where the bottom of the contact hole comes into contact with the source/drain region comprises:
implanting counter ions into the contact hole such that the counter ions are uniformly distributed at the peripheral region where the bottom of the contact hole comes into contact with the source/drain region.

10. The method according to claim 9, wherein forming a high concentration region with impurity ions carrier at a middle region of the contact hole comprises:
vertically implanting the impurity ions into the contact hole such that a bottom region of the contact hole is filled with the impurity ions, and then activating the impurity ions through RTP such that the impurity ions are diffused towards the source/drain region through the bottom of the contact hole.

11. The method according to claim 9, wherein the counter ions are obliquely implanted at an angle of 8 to 12 degrees.

12. The method according to claim 9, wherein depositing a conductive layer in the contact hole to make conductive contact comprises:
sputtering and depositing metal cobalt in the contact hole, and then performing thermal oxidation such that the metal cobalt reacts with silicon in the source/drain region to form a metal silicide; and subsequently, depositing a metal material and filling the contact hole to create conductive contact.

* * * * *